United States Patent [19]
Nelson et al.

[11] Patent Number: 5,550,480
[45] Date of Patent: Aug. 27, 1996

[54] METHOD AND MEANS FOR CONTROLLING MOVEMENT OF A CHUCK IN A TEST APPARATUS

[75] Inventors: Randall D. Nelson, Sun Lakes; Gregory L. Westbrook, Chandler, both of Ariz.

[73] Assignee: Motorola, Inc., Schaumburg, Ill.

[21] Appl. No.: 270,290

[22] Filed: Jul. 5, 1994

[51] Int. Cl.$^6$ .................................................. G01R 31/02
[52] U.S. Cl. ................................................ 324/754; 324/756
[58] Field of Search ..................................... 324/754, 756, 324/765

[56] References Cited

U.S. PATENT DOCUMENTS

| | | |
|---|---|---|
| 3,975,680 | 8/1976 | Webb . |
| 4,038,599 | 7/1977 | Bove et al. ............................. 324/754 |
| 4,328,553 | 5/1982 | Fredriksen et al. . |
| 4,583,042 | 4/1986 | Riemer . |
| 4,607,525 | 8/1986 | Turner et al. ........................... 324/754 |
| 4,780,836 | 10/1988 | Miyazaki et al. ....................... 324/765 |
| 4,929,893 | 5/1990 | Sato et al. . |
| 5,019,771 | 5/1991 | Yang et al. . |
| 5,065,092 | 11/1991 | Sigler ..................................... 324/758 |
| 5,091,692 | 2/1992 | Ohno et al. . |
| 5,315,237 | 5/1994 | Iwakura et al. . |

Primary Examiner—Ernest F. Karlsen
Assistant Examiner—Russell M. Kobert
Attorney, Agent, or Firm—Rennie William Dover

[57] ABSTRACT

A sense circuit (23) for generating an actuating signal and a method of using the actuating signal to control movement of a wafer chuck (12). The sense circuit (23) has sense input terminals (24, 28) coupled to corresponding probe-card probes (19, 18). A wafer (26) having contact pads (42, 42') is mounted on the wafer chuck (12) and moved towards the probe-card probes (18, 19). When the probe-card probes (18, 19) contact corresponding contact pads (42', 42) on the wafer, the sense circuit (23) generates an actuating signal. The actuating signal, which is generated in accordance with the heights of the contact pads (42', 42), enables control circuit (48) of the prober (11). The control circuit limits the movement of the wafer chuck (12) to prevent damage to the probe card (12) or the wafer (26).

6 Claims, 5 Drawing Sheets

METHOD AND MEANS FOR CONTROLLING MOVEMENT OF A CHUCK IN A TEST APPARATUS

BACKGROUND OF THE INVENTION

The present invention relates, in general, to a test apparatus, and more particularly, to movement of a portion of the test apparatus.

Generally, integrated devices are fabricated in a thin flat substrate material commonly referred to as a semiconductor wafer. After fabrication, the integrated devices in the semiconductor wafer are tested, the semiconductor wafer is separated or divided into individual semiconductor chips or die, and each chip is encapsulated in a package. Since each semiconductor chip typically contains a large number of integrated devices, there is a probability of producing one or more defective integrated devices. Therefore, it is desirable to test the integrated devices prior to packaging them to ensure that time, money, and manufacturing capacity are not wasted by packaging defective semiconductor chips. Moreover, testing semiconductor chips in wafer form is easier and more cost efficient than testing a single semiconductor chip that has been separated from the semiconductor wafer. In other words, wafer-level testing or probing, i.e., testing semiconductor chips before the semiconductor wafer is separated into individual chips, reduces the manufacturing costs and cycle times associated with manufacturing semiconductor products.

An important step in wafer-level testing is electrically contacting electrode pads on a semiconductor wafer with corresponding probe-card probes or wire-probes on a probe card. Failure of any of the probe-card probes to make electrical contact with a corresponding electrode pad may preclude testing the semiconductor chip or produce erroneous test results. Typically, a prober is programmed to position the semiconductor wafer so the electrode pads on the wafer electrically contact the probe-card probes. Factors that may prevent adequate electrical contact include variations in wafer-to-wafer thickness, variations in thickness within a wafer, and hardened contact bumps on the electrode pads that cause the probe-card probes to slide off the contact bumps.

One technique to ensure electrical contact between a probe-card probe and an electrode pad employs a capacitive or pneumatic sensor to sense the distance between the semiconductor wafer surface and the probe-card probes. The sensor adjusts the semiconductor wafer so the electrode pads on the wafer contact the probe-card probes. A drawback of this technique is that for large variations in the height of the electrode pads, the time required to adjust the semiconductor wafer is long. Another technique employs a mechanical switch that contacts a scribe grid on the wafer. Again, there may be a large variation in the heights of the contact pads which would require time consuming adjustments of the wafer.

Accordingly, it would be advantageous to have a method and a means for controlling a position of a semiconductor wafer in accordance with the heights of conductive pads on the wafer. It would be of further advantage for the method to include a fail-safe system to prevent the probe card or semiconductor wafer from becoming damaged.

DETAILED DESCRIPTION OF THE DRAWINGS

Generally, the present invention provides a method and a means for controlling movement of a portion of a test apparatus. The test apparatus comprises a probe card mounted to a test head and a wafer chuck mounted to a prober. The prober includes a means for moving the wafer chuck towards the probe card and a control circuit for controlling the distance the wafer chuck moves. Typically, a semiconductor wafer is mounted on the wafer chuck which moves the semiconductor wafer towards the probe card in accordance with an actuating signal received from the sensing circuit. More particularly, the sensing circuit generates the actuating signal when selected contact pads on the semiconductor wafer contact corresponding probe-card probes mounted to the probe card. In other words, the actuating signal is generated when the sensing circuit senses that the semiconductor wafer has contacted the corresponding probe-card probes. After receiving the actuating signal, the wafer chuck moves an additional distance to ensure that all of the probe-card probes on the probe card electrically contact corresponding contact pads on the semiconductor wafer. As those skilled in the art are aware, this additional distance is a predetermined distance and is typically referred to as overdrive. By way of example, the wafer chuck moves along a z-axis, i.e., a direction corresponding to a height of the wafer chuck and the overdrive ranges from approximately $-25$ microns ($\mu$m) to approximately 50 $\mu$m.

Figure 1:
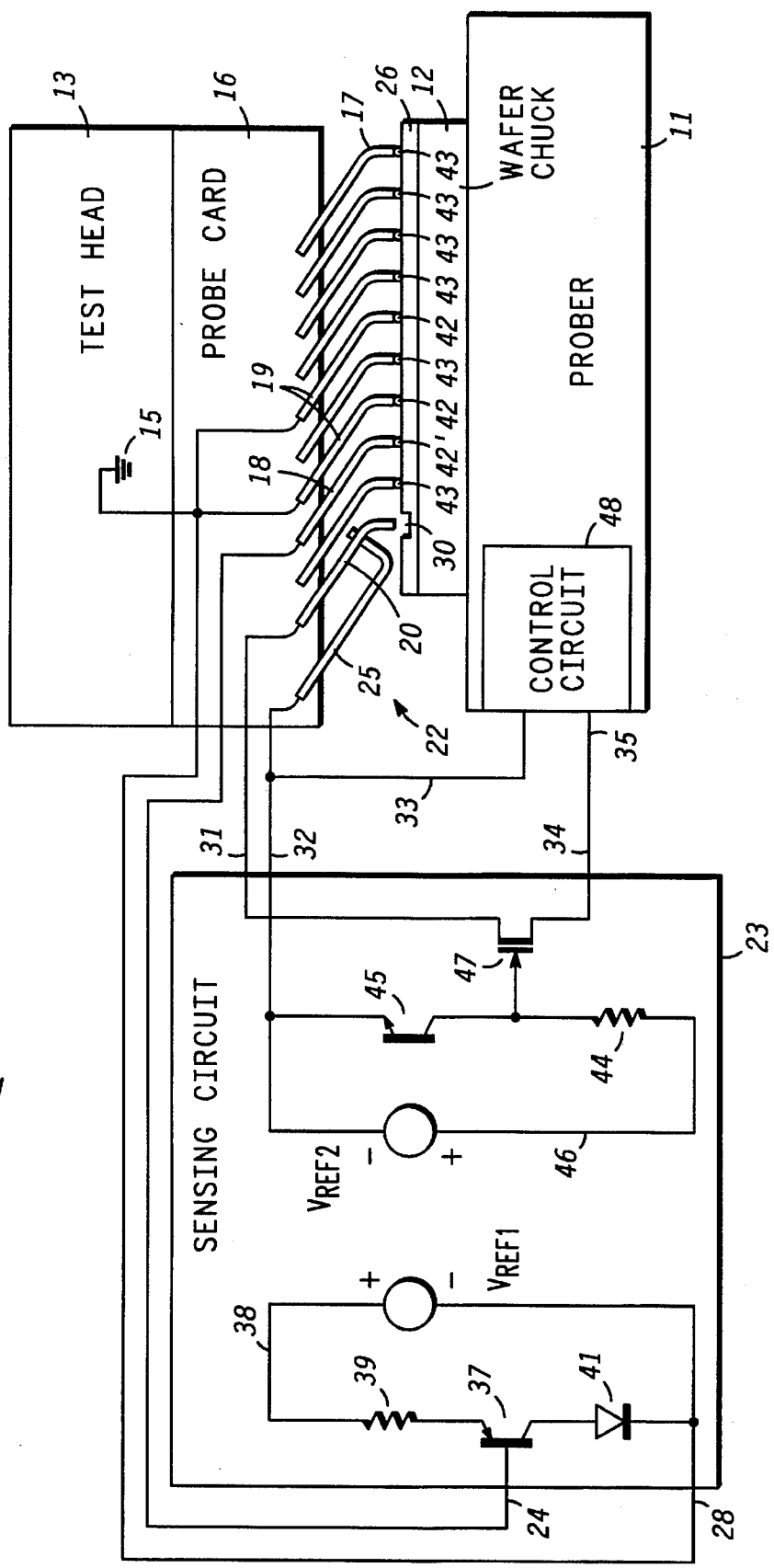
FIG. 1 illustrates a schematic of a test apparatus having a semiconductor wafer mounted thereon in accordance with a first embodiment of the present invention.

FIG. 1 illustrates a schematic of a test apparatus 10 in accordance with a first embodiment of the present invention. Test apparatus 10 includes a prober 11 having a wafer chuck 12 mounted thereon and a test head 13 connected to a probe card 16. A plurality of signal probe-card probes 17, i.e., probe-card probes for transmitting input and output electrical signals, are mounted to probe card 16. In addition, a reference probe-card probe 18, bias probe-card probes 19, and an edge-sense probe switch 22 comprising a probe-card probe 20 and a conductor 25 are mounted to probe card 16. Preferably, reference probe-card probe 18 serves as a test head reference probe-card probe 18 used by test head 13 to sense a voltage of a conductive plane or a reference plane of semiconductor wafer 26 (shown in FIG. 2). Moreover, probe-card probe 18 serves as a voltage probe and indicates or senses when contact between the probe-card probes and the semiconductor wafer occurs. It should be understood that probe-card probe 18 can be used to sense any common reference potential, such as, for example 5 volts or 15 volts.

In addition, bias probe-card probes 19 are coupled to a common reference potential 15 such as, for example, a ground potential of test head 13. Although reference potential 15 is shown as being a ground potential of test head 13, it should be understood that this is not a limitation of the present invention. In other words, reference potential 15 can be any reference voltage, such as, for example, 5 volts or 15 volts.

Test apparatus such as test apparatus 10 having prober 11, wafer chuck 12, test head 13, probe card 16, probe-card probes 17, 18, and 19, and an edge-sense probe switch 22 are well known to those skilled in the art.

FIG. 1 also shows a semiconductor wafer 26 mounted to wafer chuck 12. It should be noted that semiconductor wafer 26 may be a silicon wafer, a gallium arsenide wafer, a silicon-germanium wafer, an indium phosphide wafer, or the like. By way of example, semiconductor wafer 26 is a silicon wafer having tin-plated gold bumps 42' and 42 which serve as contact pads for mating with probe-card probes 18 and 19, respectively. In addition, semiconductor wafer 26 has tin-plated gold bumps 43 for mating with signal probe-card probes 17. It should be understood that the present invention is not limited to bumps, such as tin-plated gold bumps, for mating with probe-card probes 17, 18, and 19. In other words, probe-card probes 17, 18, and 19 can mate with wire bond pads, gold pads or bumps, aluminum pads or bumps, solder balls, and the like.

Figure 2:
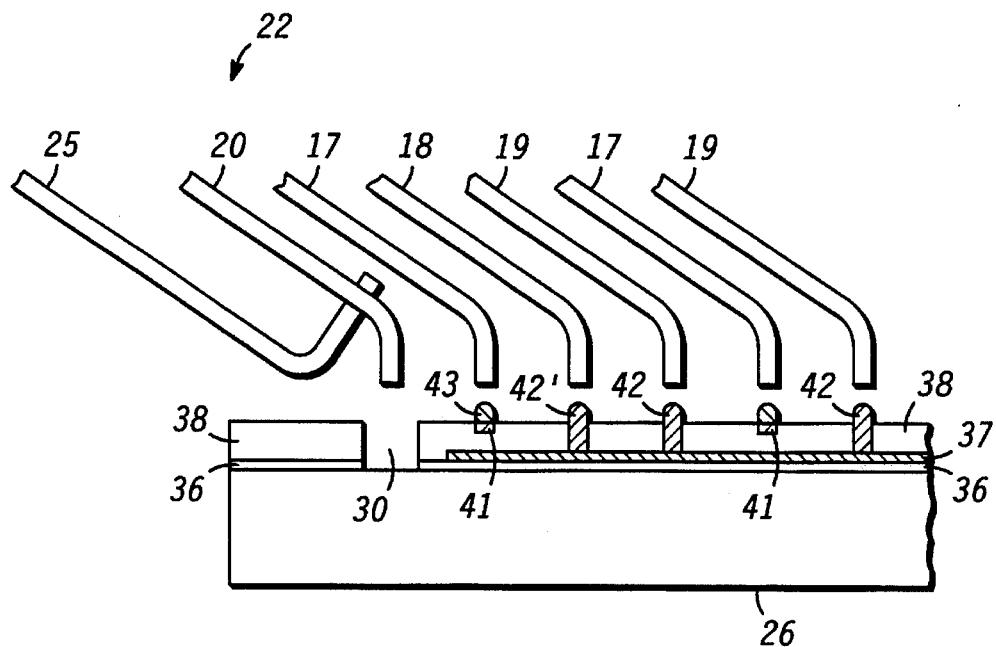
FIG. 2 illustrates a cross-sectional view of a portion of the prior art semiconductor wafer of FIG. 1.

A scribe grid or street 30 is also shown in FIG. 1. As those skilled in the art are aware, semiconductor wafers are separated into individuals semiconductor chips along the scribe grids. In accordance with the first embodiment of the present invention, scribe grid 30 serves as a contact location for edge-sense probe switch 22. To further illustrate contact between edge-sense probe switch 22 and scribe grid 30, as well as contact between probe-card probes 18, 19, and 17, and bumps 42', 42, and 43, respectively, an enlarged cross-sectional view of portions of semiconductor wafer 26, probe-card probes 17, 18, and 19, and edge-sense switch 22 are shown in FIG. 2. Since probe-card probes for mating with contact pads and semiconductor wafers having the contact pads are known in the art, FIG. 2 is labeled as prior art. It should be understood that traces 41 represent the plurality of input-output or electrical signal traces present on a semiconductor wafer. It should be further understood that the same reference numerals are used in the figures to denote the same elements.

What is shown in FIG. 2 is a portion of semiconductor wafer 26 having a layer of dielectric material 36 disposed thereon. A portion of layer of dielectric material 36 is covered with a layer of conductive material 37. By way of example, layer of conductive material 37 is a reference voltage plane such as, for example, a ground plane. Further, layer of conductive material 37 and portions of layer of dielectric material 36 not covered by layer of conductive material 37 are covered by a layer of dielectric material 38. Conductive traces 41 are formed on portions of layer of dielectric material 38. Suitable materials for layers of dielectric material 36 and 38 include silicon dioxide, silicon nitride, and the like. Suitable materials for layer of conductive material 37 and traces 41 include aluminum, gold, copper, silicides, and the like. A plurality of bumps 42 are formed to contact portions of layer of conductive material 37. Likewise, bumps 43 are formed to contact conductive traces 41.

In addition, portions of edge-sense probe switch 22 comprising probe-card probe 20 in contact with a conductor 25 are shown in FIG. 2. Wire-probe 20 and conductor 25 cooperate to form a switch 22 which is normally closed. When probe-card probe 20 contacts scribe grid 30 of semiconductor wafer 26 with a sufficient force, probe-card probe 20 becomes separated from conductor 25, thereby opening switch 22. It should be understood that probe-card probes, edge-sense probe switches, and wafers having bumps, conductive layers, conductive traces are well known in the art. These features have been emphasized in FIG. 2 to better illustrate the operation of the switching circuit of the present invention.

Referring again to FIG. 1 and in accordance with the present invention, probe card 16 is coupled to prober 11 via a sensing circuit 23. More particularly, a first end of reference probe-card probe 18 is coupled to a sense input terminal 24 and first ends of bias probes 19 are coupled to a sense input terminal 28. A first end of probe-card probe 20 is coupled to a sense output terminal 31, an end of conductor 25 is coupled to a sense output terminal 32 and a prober input terminal 33. Further, a sense output terminal 34 is coupled to prober input terminal 35.

In the embodiment shown in FIG. 1, sensing circuit 23 comprises a PNP bipolar transistor 37 having an emitter terminal coupled to a power conductor 38 via a resistor 39. Preferably, power conductor 38 is one conductor of a reference voltage, $V_{REF1}$. A base terminal of transistor 37 serves as sense input terminal 24 of sensing circuit 23. A collector terminal of transistor 37 is coupled to the anode terminal of a light emitting diode 41. The cathode terminal of light emitting diode 41 is coupled to sense input terminal 28, which is also connected to the common reference potential 15 in test head 13.

In addition, sensing circuit 23 includes an NPN bipolar transistor 45 having a base optically coupled to light emitting diode 41. An emitter terminal of transistor 45 is coupled to the second portion of conductor 25 and serves as a sense output terminal 32 of sensing circuit 23. A collector terminal of transistor 45 is coupled to a power conductor 46 via a resistor 44 and to a gate input terminal of a field effect transistor 47. Preferably, power conductor 46 is one conductor of a reference voltage, $V_{REF2}$. A source terminal of field effect transistor 47 is coupled to the first end of probe-card probe 20 and serves as sense output terminal 31. A drain terminal of field effect transistor 47 is coupled to prober input terminal 35 and serves as sense output terminal 34 of sensing circuit 23. To prevent current from flowing from prober 11 into semiconductor wafer 26, $V_{REF1}$ is electrically isolated from $V_{REF2}$. Accordingly, it is preferable to isolate $V_{REF1}$ from $V_{REF2}$ with an optocoupler.

In operation, prober 11 moves wafer chuck 12 and semiconductor wafer 26 mounted on wafer chuck 12 towards probe card 16 and thus towards probe-card probes 17, 18, and 19. Before one of probe-card probes 18 or 19 contacts a corresponding bump 42' or 42, respectively, the base of PNP bipolar transistor 37 is open and substantially no current flows through resistor 39. When one of the bias probe-card probes 19 contacts a corresponding bump 42 on semiconductor wafer 26, the bump 42 becomes coupled to a common reference potential 15 of test apparatus 10 because bias probe-card probes 19 are connected to reference potential 15. However, since only one of the probe-card probes 18 or 19 contacts a respective bump 42' or 42, substantially no current flows through resistor 39, the emitter and collector terminals of PNP bipolar transistor 37, and diode 41.

Movement of semiconductor wafer 26 towards probe-card probe card probes 17, 18, and 19 continues and results in probe-card probe 18 contacting a corresponding bump 42' which is electrically coupled to bump 42. Thus, the base of PNP bipolar transistor 37, i.e., sense input terminal 24, is coupled to common reference potential 15 via probe-card probe 18, bump 42' bump 42 and probe-card probe 19. Consequently, transistor 37 turns on and a current flows through its emitter terminal. It should be understood that transistor 37 turns on when probe-card probe 18 and at least one probe-card probe 19 contact their respective bumps. Accordingly, current flows through diode 41 causing it to emit light. In other words, light is emitted from diode 41 when transistor 37 is biased in a forward active mode of operation. In accordance with the embodiment shown in FIG. 1, light is emitted from diode 41 when input terminals 24 and 28 are set to a ground potential.

Although probe-card probe 19 is described as electrically contacting bump 42 before probe-card probe 18 contacts bump 42' it should be understood that this is not a limitation of the present invention, and that probe-card probe 18 may contact bump 42' before probe-card probe 19 contacts bump 42.

Light emitted from diode 41 is received at the base of NPN bipolar transistor 45, turning it on. Thus, a current flows through the collector terminal of transistor 45 and through resistor 44, creating a voltage drop across resistor 44 and resulting in a lower voltage appearing at the gate terminal of transistor 47. The lower gate voltage turns transistor 47 off and substantially stops the flow of a drain-source current through transistor 47. The absence of a drain-source current flow in transistor 47 serves as an actuating signal from sensing circuit 23 which indicates to control circuit 48 in prober 11 that the probe-card probes have contacted semiconductor wafer 26. Thus, an optical signal is converted into the actuating signal. Control circuit 48 controls the movement of wafer chuck 12 and thus wafer 26. By way of example, control circuit 48 serves as a z-axis control circuit. After receiving the actuating signal, control circuit 48 signals the wafer chuck to move a predetermined distance, commonly referred to as overdrive. This predetermined distance ensures that all the probe-card probes 17, 18, and 19 electrically contact corresponding bumps 43, 42', and 42, respectively, on semiconductor wafer 26.

In addition, sensing circuit 23 incorporates edge-sense probe switch 22 as a fail-safe mechanism. During normal operation of test apparatus 10, probe-card probe 20 contacts conductor 25, thus edge-sense probe switch 22 is a closed switch. However, if one of probe-card probes 18 or 19 does not electrically contact a corresponding bump 42' or 42, respectively, sensing circuit 23 will not send the actuating signal to control circuit 48 and control circuit 48 will not halt the movement of wafer chuck 12. For example, electrical contact between the probe-card probes and the corresponding bumps may not occur because one of probe-card probes 18 or 19 may slip off of corresponding bumps 42' or 42, respectively, or one of probe-card probes 18 and 19 may not electrically contact a corresponding bump 42' or 42, respectively, because the bump is covered with an oxide or a contaminant, or one of the bumps may be missing. Consequently, wafer chuck 12 continues moving towards probe card 16.

To prevent damage to either probe card 16 or semiconductor wafer 26, edge-sense probe switch 22 transmits an actuating signal to control circuit 48. More particularly, probe-card probe 20 contacts semiconductor wafer 26 at scribe grid 30, causing probe-card probe 20 to separate from conductor 25 thereby halting the flow of the drain-source current in transistor 47. The absence of a drain-source current flow in transistor 47 serves as an actuating signal for control circuit 48 to halt the movement of wafer chuck 12. Thus, in accordance with the present invention, edge sense switch 22 comprising probe-card probe 20 and conductor 25 serve as a fail-safe to stop wafer chuck 12, thereby preventing damage to either probe card 16 or semiconductor wafer 26. Although probe-card probe 20 is described as making contact with semiconductor wafer 26 in scribe grid 30, it should be understood that this is not a limitation of the present invention, and that probe-card probe 20 may contact another portion of semiconductor wafer 26.

Figure 3:
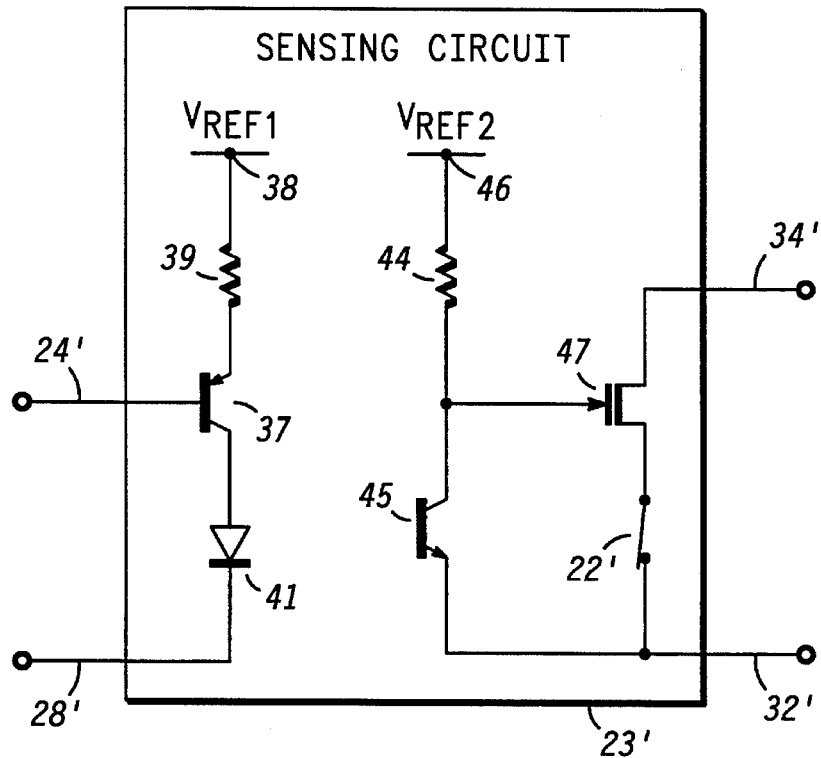
FIG. 3 illustrates a schematic of a switching circuit in accordance with a second embodiment of the present invention.

FIG. 3 illustrates a second embodiment of a sensing circuit 23' which is similar to sensing circuit 23 of FIG. 1. Sensing circuit 23' includes a switch 22' connected in series with the source of field effect transistor 47, whereas sensing circuit 23 incorporates an edge-sense switch 22 of probe card 16 as the switch. Thus, it should be appreciated by those skilled in the art that switch 22' of sensing circuit 23' is analogous to edge-sense switch of FIG. 1. Sensing circuit 23' further includes a PNP bipolar transistor 37 having an emitter terminal coupled to power conductor 38 of reference voltage $V_{REF1}$ via resistor 39. The base terminal of transistor 37 serves as sense input terminal 24' of sensing circuit 23'. A collector terminal of transistor 37 is coupled to the anode terminal of light emitting diode 41. The cathode terminal of light emitting diode 41 is coupled to sense input terminal 28'.

In addition, sensing circuit 23' includes an NPN bipolar transistor 45 having a base optically coupled to light emitting diode 41. A collector terminal of transistor 45 is coupled to power conductor 46 of reference voltage $V_{REF2}$, via a resistor 44 and to a gate input terminal of field effect transistor 47. A source terminal of field effect transistor 47 is coupled to an emitter terminal of transistor 45 by switch 22'. More particularly, the source terminal of field effect transistor 47 electrically contacts one terminal of a switch 22' and the emitter terminal of transistor 45 electrically contacts the second terminal of switch 22'. The second terminal of switch 22' serves as sense output terminal 32' and a drain terminal of field effect transistor 47 serves as the sense output terminal 34'.

Figure 4:
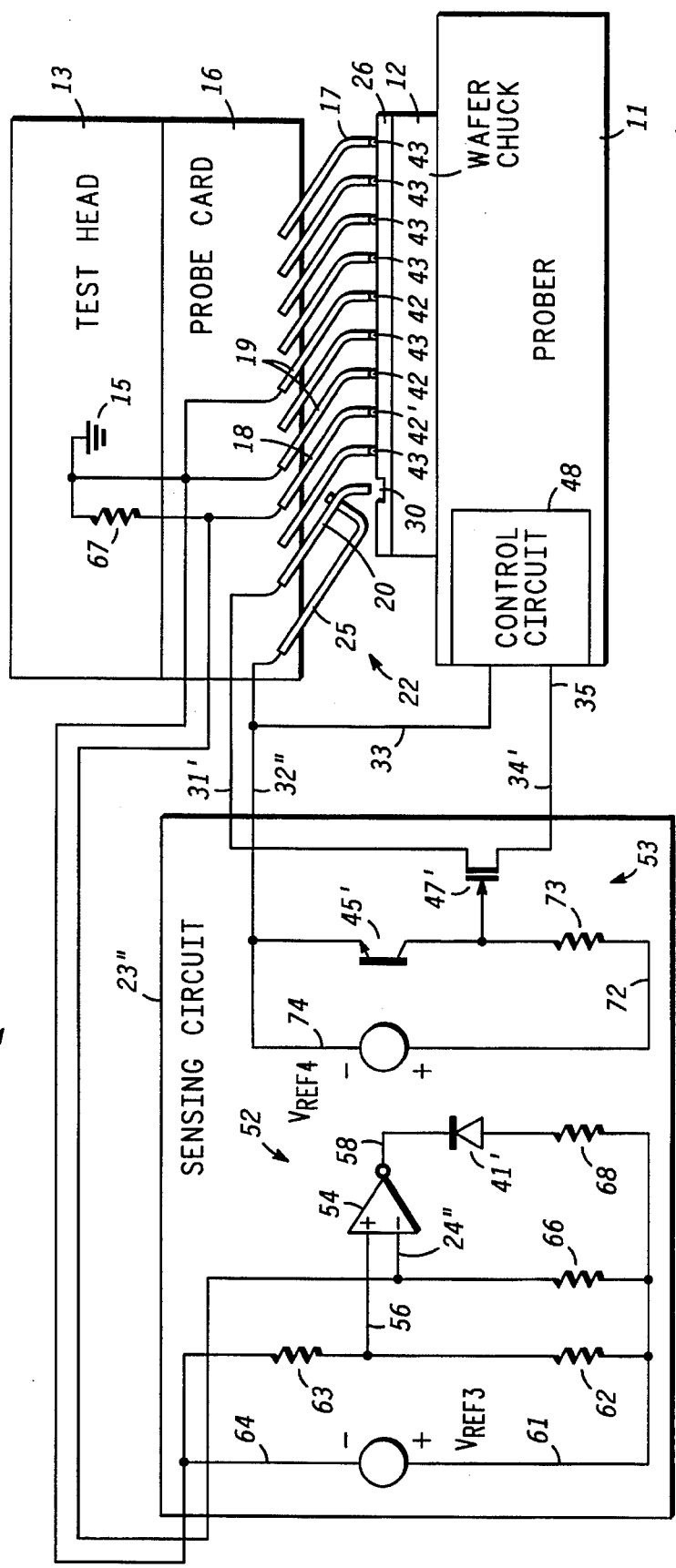
FIG. 4 illustrates a schematic of a switching circuit in accordance with a third embodiment of the present invention.

FIG. 4 illustrates a schematic of a test apparatus 51 having a sensing circuit 23" in accordance with a third embodiment of the present invention. Test apparatus 51 is distinguished from test apparatus 10 by sensing circuit 23". Accordingly, test apparatus 51 includes prober 11, wafer chuck 12, test head 13', probe card 16, probe-card probes 17, 18, and 19, and an edge-sense probe switch 22. In addition, semiconductor wafer 26 having bumps 42, 42' and 43 and scribe grid 30 is mounted to wafer chuck 12.

Sensing circuit 23" comprises an input portion 52 electrically isolated from an output portion 53. Input portion 52 includes a comparator 54 having a noninverting input terminal 56, an inverting input terminal 24", and an output terminal 58. Inverting input terminal 24" serves as a sense input terminal. By way of example, comparator 54 is an LM2903 device and manufactured by Motorola, Inc. Although comparator 54 is not shown as being coupled to a power supply, those skilled in the art will understand that comparators such as comparator 54 are active devices and therefore include terminals for coupling to upper and lower reference voltage levels.

Non-inverting input terminal 56 is coupled to a power conductor 61 of a power supply, i.e., $V_{REF3}$, by a resistor 62. In addition, non-inverting input terminal 56 is coupled to a second power conductor 64 of $V_{REF3}$ by a resistor 63. Resistors 62 and 63 and power supply $V_{REF3}$ form a voltage divider network for setting a voltage at non-inverting input terminal 56. Likewise, inverting input terminal 24" is coupled to first power conductor 61 of $V_{REF3}$ by a resistor 66, and to a test system reference potential 15 via a resistor 67. It should be noted that resistor 67 is mounted in test head 13. Although reference potential 15 is shown as being a ground potential of test head 13, it should be understood that this is not a limitation of the present invention. In other words, reference potential 15 can be any reference voltage, such as, for example, 5 volts or 15 volts.

Output terminal 58 is coupled to power conductor 61 of voltage source $V_{REF3}$ by a resistor 68 in series with a light emitting diode 41'. $V_{REF3}$ may be a battery, a DC-DC converter, an AC-DC converter, etc. Thus, the type of power supply is not a limitation of the present invention.

Output portion 53 of sensing circuit 23" comprises an NPN bipolar transistor 45' having a base optically coupled to light emitting diode 41'. A collector terminal of transistor 45' is coupled to a power conductor 72 of voltage source $V_{REF4}$ by a resistor 73 and to a gate input terminal of a field effect transistor 47'. An emitter terminal of transistor 45' is coupled to a second power conductor 74 of voltage source $V_{REF4}$ and serves as a sense output terminal 32". A source terminal of field effect transistor 47' is coupled to an emitter terminal of transistor 45' by means of switch 22. More particularly, the source terminal serves as a sense output terminal 31' and is electrically connected to a first end of probe 20. A first end of conductor 25 is coupled to sense output terminal 32" and to input terminal 33 of prober 11. The drain terminal of field effect transistor 47 serves as a sense circuit output terminal 34'.

By way of example, resistors 62 and 66 have resistance values of approximately 100,000 ohms, resistor 63 has a resistance value of approximately 510 ohms, resistor 67 has a resistance value of approximately 1,000 ohms, resistors 68 and 73 have resistance values of approximately 10,000 ohms, and voltage source $V_{REF3}$ has a voltage of approximately 9 volts. Preferably, diode 41' and transistor 45' are a unitary device such as, for example, an optical coupler having part number MOC8050 and sold by Motorola, Inc.

In operation, prober 11 moves wafer chuck 12 and semiconductor wafer 26 mounted on wafer chuck 12 towards probe card 16 and thus towards probe-card probes 17, 18, and 19. Before one of probes 18 or 19 contacts a bump 42' or 42, respectively, the voltage appearing on non-inverting input terminal 56 is less than the voltage appearing on inverting input terminal 24" and the voltage appearing at output terminal 58 is approximately 8.5 volts. It should be noted that in accordance with the exemplary resistor and voltage supply values given supra for input portion 52, the voltage at input terminal 56 is approximately 45 mv and the voltage at input terminal 24" is approximately 80 mv. When the voltage at output terminal 58 is approximately 8.5 volts, only a small amount of leakage current flows in diode 41'. In other words, substantially no current flows in diode 41'. When one of the bias probe-card probes 19 contacts a corresponding bump 42 on semiconductor wafer 26, the voltages at input terminals 56 and 24" remain unchanged, thus diode 41 continues to not emit light.

Movement of semiconductor wafer 26 towards probe-card probes 17, 18, and 19 continues and results in reference probe-card probe 18 contacting a corresponding bump 42' which is electrically coupled to bump 42. Thus, sense input terminal 24" is coupled to reference potential 15 via probe-card probe 18, bump 42' bump 42 and probe-card probe 19. Connecting sense input terminal 24" to reference potential 15 changes the voltage appearing at terminal 24" such that the voltage appearing on non-inverting input terminal 56 is greater than the voltage appearing on inverting input terminal 24". Consequently, the voltage appearing at output terminal 58 is approximately equal to 0 volts. For the exemplary resistor and voltage supply values given supra for input portion 52, the voltage at input terminal 56 is approximately 45 mv, the voltage at input terminal 24" is approximately 30 µvolts, and the voltage appearing at output terminal 58 is approximately zero volts.

Thus, when probes 18 and 19 are not in contact with bumps 42' and 42, respectively, the voltage appearing on noninverting input terminal 56 is approximately 45 millivolts (mV), the voltage appearing on inverting input terminal 24" is approximately 80 mv, and the voltage appearing on output terminal 58 is approximately 8.5 volts. When probes 18 and 19 contact bumps 42' and 42, respectively, the voltage appearing on noninverting input terminal 56 is approximately 45 millivolts (mV), the voltage appearing on inverting input terminal 24" is approximately 30 microvolts (µvolts), and the voltage appearing on output terminal 58 is approximately zero volts.

When the voltage at output terminal 58 is approximately equal to zero volts, diode 41' turns on and thus conducts a current and emits light. Although probe-card probe 19 is described as touching bump 42 before probe-card probe 18 contacts bump 42', it should be understood that this is not a limitation of the present invention, and that probe-card probe 18 may contact bump 42' before probe-card probe 19 contacts bump 42.

The presence of light from diode 41' at the base of NPN bipolar transistor 45' turns on transistor 45' and generates current in the collector terminal of transistor 45'. Thus, the voltage appearing at the gate terminal of transistor 47' turns off transistor 47' and substantially stops the flow of a drain-source current through transistor 47'. The absence of a drain-source current flow in transistor 47' serves as an actuating signal from sensing circuit 23" which indicates to control circuit 48 in prober 11 that the probe-card probes have contacted semiconductor wafer 26. Control circuit 48 controls the movement of wafer chuck 12 and thus semiconductor wafer 26. After receiving the actuating signal, control circuit 48 signals the wafer chuck to move a predetermined distance, commonly referred to as overdrive. This predetermined distance ensures that all the probe-card probes 17, 18, and 19 electrically contact corresponding bumps 43, 42' and 42 respectively, on semiconductor wafer 26.

In addition, sensing circuit 23" incorporates edge-sense probe switch 22 as a fail-safe mechanism. During normal operation of test apparatus 51, probe-card probe 20 contacts conductor 25, thus edge-sense probe switch 22 is a closed switch. However, if one of probe-card probes 18 or 19 does not electrically contact a corresponding bump 42' or 42, respectively, sensing circuit 23 will not send the actuating signal to control circuit 48 and control circuit 48 will not halt the movement of wafer chuck 12. For example, electrical contact between the probe-card probes and the corresponding bumps may not occur because one of probe-card probes 18 or 19 may slip off of corresponding bumps 42' or 42, respectively, or one of probe-card probes 18 and 19 may not electrically contact a corresponding bump 42' or 42, respectively, because the bump is covered with an oxide or a contaminant, or one of the bumps may be missing. Consequently, wafer chuck 12 continues moving towards probe card 16.

To prevent damage to either probe card 16 or semiconductor wafer 26, edge-sense probe switch 22 transmits an actuating signal to control circuit 48. More particularly, probe-card probe 20 contacts semiconductor wafer 26 at scribe grid 30, causing probe-card probe 20 to separate from conductor 25 thereby halting the flow of the drain-source current in transistor 47. The absence of a drain-source current flow in transistor 47 serves as an actuating signal for control circuit 48 to halt the movement of wafer chuck 12. Thus, in accordance with the present invention, edge sense switch 22 comprising probe-card probe 20 and conductor 25 serves as a fail-safe to stop wafer chuck 12, thereby preventing damage to either probe card 16 or semiconductor wafer 26. Although probe-card probe 20 is described as making contact with semiconductor wafer 26 in scribe grid 30, it should be understood that this is not a limitation of the present invention, and that probe-card probe 20 may contact another portion of semiconductor wafer 26.

Figure 5:
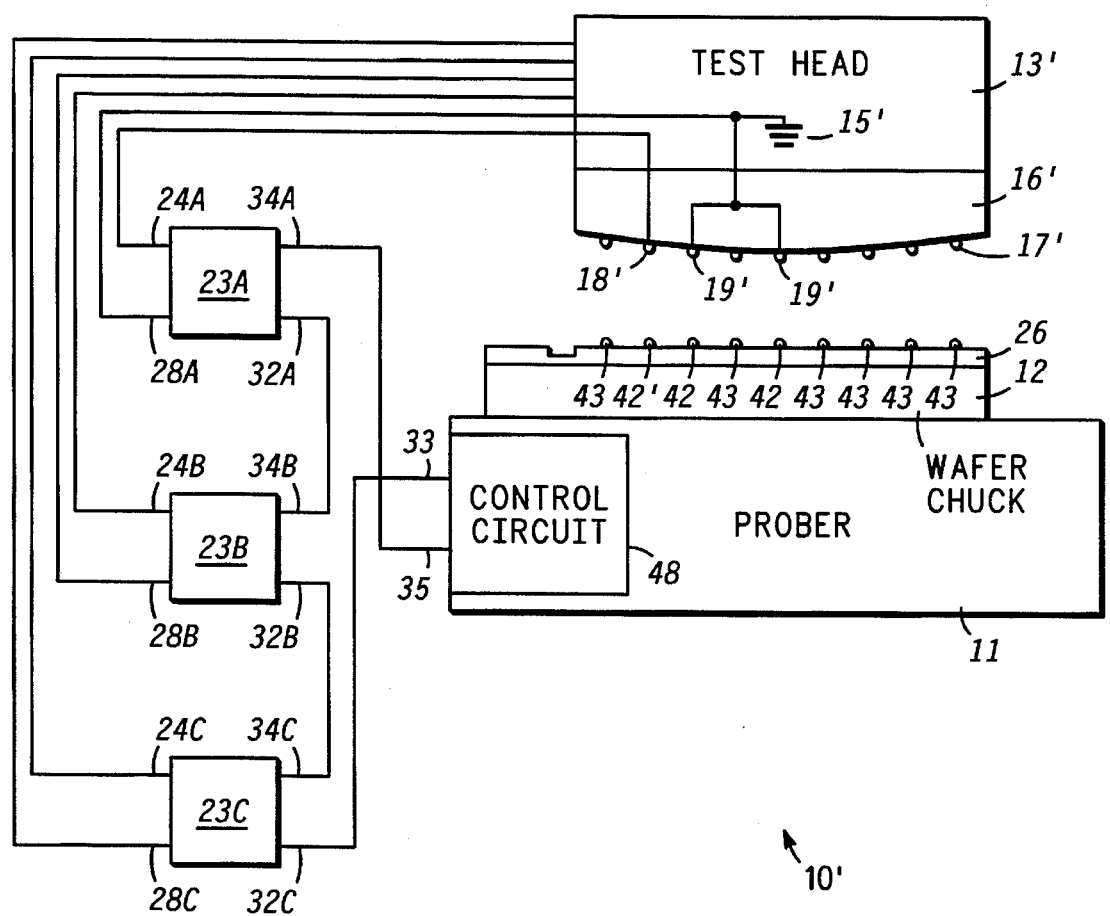
FIG. 5 illustrate a schematic of a test apparatus in accordance with a fourth embodiment of the present invention.

FIG. 5 illustrates a schematic of a test apparatus 10' having sensing circuits 23A, 23B, and 23C in accordance with a membrane probe card embodiment of the present invention. Test apparatus 10' includes a prober 11 having a wafer chuck 12 mounted thereon and a test head 13' connected to a membrane probe card 16'. Prober 11 contains a control circuit 48 as described with reference to FIG. 1. It should be noted that the differences between test apparatus 10' and test apparatus 10 of FIG. 1 are that test apparatus 10' includes three circuits 23A, 23B, and 23C as well as a membrane probe card 16'. Membrane probe cards are well known to those skilled in the art. A plurality of signal probe-card probes 17' for transmitting input and output electrical signals are formed on membrane probe card 16'. In addition, a reference probe-card probe 18' and bias probe-card probes 19' are formed on membrane probe card 16'. Preferably, reference probe-card probe 18' serves as a test head reference used by test head 13' to sense and properly set the ground voltage at zero volts on semiconductor wafer 26. Moreover, probe-card probe 18' serves as a voltage probe and indicates or senses when contact between the probe-card probes and the semiconductor wafer occurs. It should be understood that probe-card probe 18' can be used to sense any reference potential, such as, for example 5 volts or 15 volts.

In addition, bias probe-card probes 19' are coupled to a common reference potential 15' such as, for example a ground potential of test head 13'. Although reference potential 15' is shown as being a ground potential of test head 13' it should be understood that this is not a limitation of the present invention. In other words, reference potential 15' can be any reference voltage. Test apparatus such as test apparatus 10' having prober 11, wafer chuck 12, test head 13', membrane probe card 16', and probe-card probes 17', 18', and 19' are well known to those skilled in the art. FIG. 5 also shows a semiconductor wafer 26 mounted to wafer chuck 12. It should be noted that semiconductor wafer 26 was described with reference to FIGS. 1 and 2.

Probe card 16' is coupled to prober 11 via three sensing circuits 23A, 23B, and 23C. It should be understood that sensing circuits 23A, 23B, and 23C are identical to sensing circuit 23 of FIG. 1, but have been provided with alphanumeric designations to simplify the description of test apparatus 10'. Thus, sensing circuit 23A has input terminals 24A and 28A and output terminals 32A and 34A, sensing circuit 23B has input terminals 24B and 28B and output terminals 32B and 34B, and sensing circuit 23C has input terminals 24C and 28C and output terminals 32C and 34C. It should be further understood that FIG. 5 shows only a single side of membrane probe card 16' and that in the embodiment shown reference and bias probe-card probes are on three sides of membrane probe 16' (shown in FIG. 6). Briefly referring to FIG. 6, reference probe-card probe 18' is coupled to sense input terminal 24A and bias probe-card probes 19' on a first side of membrane probe card 16' are coupled to sense input terminal 28A. Reference probe-card probe 18" is coupled to sense input terminal 24B and bias probe-card probes 19" on a second side of membrane probe card 16' are coupled to sense input terminal 28B. Reference probe-card probe 18'" is coupled to sense input terminal 24C and bias probe-card probes 19'" on a third side of membrane probe card 16' are coupled to sense input terminal 28C. Although three sides of membrane probe card 16' are described as being coupled to sensing circuits 23A, 23B, and 23C, it should be understood that this is not a limitation of the present invention.

Referring again to FIG. 5, sense output terminal 34A of sensing circuit 23A is connected to prober input terminal 35 and sense output terminal 32A of sensing circuit 23A is connected to sense output terminal 34B of sensing circuit 23B. Likewise, sense output terminal 32B of sensing circuit 23B is connected to sense output terminal 34C of sensing circuit 23C and sense output terminal 32C of sensing circuit 23C is connected to prober input terminal 33.

Figure 6:
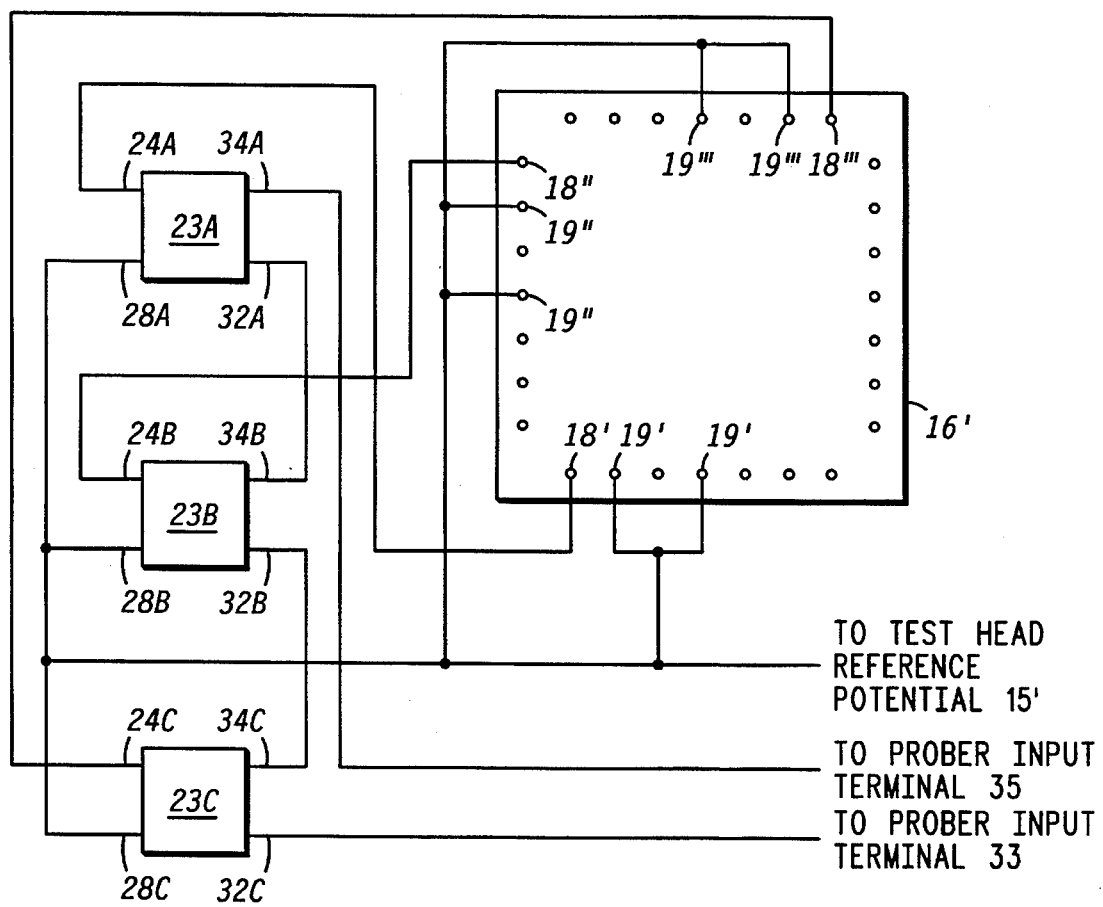
FIG. 6 illustrates an enlarged schematic of a portion of the test apparatus of FIG. 5.

FIG. 6 illustrates an enlarged schematic of a portion of test apparatus 10' of FIG. 5 showing one embodiment of probe card 16' having probes coupled to test head reference potential 15' and to sensing circuits 23A, 23B, and 23C. More particularly, FIG. 6 shows a reference probe-card probe 18' and two bias probe-card probes 19' on one side of probe card 16' coupled to sense input terminals 24A and 28A, respectively. In addition, bias probe-card probes 19' are connected to test head reference potential 15'. Also shown in FIG. 6 are reference probe-card probe 18" and two bias probe-card probes 19" on another side of probe card 16' coupled to sense input terminals 24B and 28B, respectively, and reference probe-card probe 18'" and two bias probe-card probes 19'" on yet another side of probe card 16' coupled to sense input terminals 24C and 28C, respectively. Bias probe-card probes 19" and 19'" are also connected to the test head reference potential 15'. By way of example, test head reference potential is set at a ground potential.

In operation, prober 11 moves wafer chuck 12 and semiconductor wafer 26 mounted on wafer chuck 12 towards probe card 16' and thus towards probe-card probes 17', 18', 19', 18", 19", 18'", and 19'" (probe-card probes 17' are shown in FIG. 5). When bias probes 18' and 19' contact corresponding bumps 42' and 42, respectively, sensing circuit 23A becomes enabled, i.e., capable of conducting current. Likewise, when bias probes 18" and 19" contact corresponding bumps 42' and 42, respectively, sensing circuit 23B becomes enabled, i.e., capable of conducting current. When bias probes 18'" and 19'" contact corresponding bumps 42' and 42, respectively, sensing circuit 23C becomes enabled, i.e., capable of conducting current. Accordingly, when sensing circuits 23A, 23B, and 23C are enabled and current flows from prober input terminal 35 to prober input terminal 33, indicating to control circuit 48 that probe-card probes have contacted semiconductor wafer 26. In other words, the presence of a current from prober input terminal 35 to prober input terminal 33 serves as an actuating signal indicating that probe-card probes have contacted semiconductor wafer 26. It should be noted that prober 11 having control circuit 48 and input terminals 33 and 35 is shown in FIGS. 1, 4, and 5, and described with reference to FIG. 1.

By now it should be appreciated that a method and a means have been provided for indicating when probe-card probes are in contact with contact pads on a semiconductor wafer. This signal, often referred to as an on-wafer signal, provides a more accurate measure of the separation of a semiconductor wafer and probe-card probes than such methods as capacitive or pneumatic sensing. By way of example, the method and means of the present invention provides a more accurate indication of z-axis position than capacitive sensing. In accordance with the present invention, a sensing circuit provides an on-wafer signal to a control circuit of a prober when two probe-card probes become electrically coupled to corresponding contact pads on a semiconductor wafer. The contact pads may be bumps, bond pads, or the like. The on-wafer signal is generated in accordance with the heights of the contact pads rather than the top surface of the semiconductor or the bottom of the scribe grid, resulting in a more accurate setting of z-axis position during probing. Additionally, a fail-safe mechanism is included in the present invention that will generate the on-wafer signal in the event that the two probe-card probes do not become electrically coupled and therefore unable to generate the on-wafer signal.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the sense circuit may include additional features such as audible or visual signals alarm to indicate the absence of electrical contact between two probe-card probes.

We claim:

1. A method for controlling movement of a chuck, comprising the steps of:

providing a test apparatus comprising a test head, a probe card, the chuck, and a prober, wherein the probe card includes at least one probe-card probe and is mounted to the test head, and the chuck is mounted to the prober;

providing a sensing circuit having a first input terminal, a second input terminal, a first output terminal, and a second output terminal, the first and second input terminals coupled to the at least one probe-card probe and the first and second output terminals coupled to the prober;

mounting a substrate to the chuck, the substrate having first and second contact pads;

temporarily coupling the first and second input terminals of the sensing circuit to the first and second contact pads of the substrate via the at least one probe-card probe;

generating a current;

transmitting a portion of the current through the first input terminal, the at least one probe-card probe, the first contact pad, the second contact pad, and the second input terminal; and generating an electrical signal for controlling the movement of the chuck, wherein the electrical signal is coupled to the prober via at least the first output terminal of the sensing circuit.

2. The method of claim 1, wherein the step of providing a test apparatus includes providing the prober with a z-axis control circuit and mounting the chuck to the prober.

3. The method of claim 1, wherein the step of providing a sensing circuit includes the steps of:

providing a first transistor having a first current conductor, a second current conductor, and a first control electrode, wherein the first control electrode serves as the first input terminal;

providing a second transistor having a third current conductor and a fourth current conductor and a current control portion, wherein the fourth current conductor serves as a first output terminal;

providing a third transistor having a fifth current conductor, a sixth current conductor, and a second control electrode, wherein the fifth current conductor serves as a second sense output terminal and the sixth current conductor serves as a third sense output terminal;

providing a diode having a cathode and an anode;

coupling a first power electrode to the first current conductor;

coupling the second current conductor to the anode of the diode;

coupling the cathode of the diode to a reference potential, the cathode of the diode serving as the second input terminal; and coupling the third current conductor to a second power electrode and to the second control electrode.

4. The method of claim 3, wherein the steps of providing a first transistor, providing a second transistor, and providing a third transistor include providing the first transistor as a PNP bipolar transistor, providing the second transistor as an NPN bipolar transistor, and providing the third transistor as a field effect transistor and the diode as a light emitting diode.

5. The method of claim 3 further including optically coupling the diode and the current control portion of the second transistor.

6. The method of claim 1, wherein the step of providing a test apparatus includes providing the probe card as one of a needle probe card or a membrane probe card.

* * * * *